BEST AVAILABLE COPY

United States Patent [19]
Gordon et al.
[11] 3,895,267
[45] July 15, 1975

[54] ELECTRONIC CIRCUIT MODULE WITH PRINTED CIRCUIT BOARD AND GROUNDING MEANS

[75] Inventors: Bernard M. Gordon, Magnolia; Brant W. Becker, Sudbury; Charles R. Prescott, Wilmington, all of Mass.

[73] Assignee: Analogic Corporation, Wakefield, Mass.

[22] Filed: Mar. 11, 1974

[21] Appl. No.: 449,905

[52] U.S. Cl. .......... 317/120; 317/100; 317/101 CB; 339/17 N
[51] Int. Cl.[2] .......... H05K 5/03
[58] Field of Search .......... 220/4 B, 55 B; 317/100, 317/120, 101 R, 101 D, 101 CB, 101 CM, 101 PH; 339/17 L, 17 LC, 17 N, 17 T

[56] References Cited

UNITED STATES PATENTS

| | | | |
|---|---|---|---|
| 3,033,913 | 5/1962 | Dietze | 220/4 B |
| 3,096,942 | 7/1963 | Madansky | 339/17 T |
| 3,244,311 | 4/1966 | Lawson | 220/4 B |
| 3,582,714 | 6/1971 | Shmurak | 317/100 |
| 3,631,299 | 12/1971 | Meyer | 317/120 |
| 3,684,925 | 8/1972 | Noff, Jr. | 317/100 |
| 3,686,533 | 8/1972 | Garnier | 174/DIG. 3 |
| 3,816,911 | 6/1974 | Knappenberger | 317/101 R |

*Primary Examiner*—Gerald P. Tolin
*Attorney, Agent, or Firm*—Weingarten, Maxham & Schurgin

[57] ABSTRACT

A modular housing for an electronic circuit having a low profile compatible with planar circuit boards and arranged for plug connection to a circuit board by movement parallel to the board surface and providing electrical shielding for the circuit.

5 Claims, 2 Drawing Figures

ELECTRONIC CIRCUIT MODULE WITH PRINTED CIRCUIT BOARD AND GROUNDING MEANS

FIELD OF THE INVENTION

This invention relates to electronic circuit housings and more particularly to a modular housing for removable connection to a circuit board of planar configuration.

BACKGROUND OF THE INVENTION

Electronic circuit boards containing interconnected components are well known and widely employed in electronic apparatus. These circuit boards have printed or etched conductive paths thereon interconnecting components and subcircuits which are attached to one or more board surfaces. The circuit boards and the components thereon are of generally low profile to present a generally planar configuration, and multiple boards of similar configuration are often mounted in parallel arrangement in a suitable housing. Modular electronic circuits are also known wherein a circuit is contained within a unitary housing having electrical terminals extending therefrom and adapted for connection to an associated circuit or apparatus.

Such modular circuits are usually connected on a circuit board by plugging the module terminals into an associated connector or by solderinig the terminals directly to corresponding connection points on the circuit board.

SUMMARY OF THE INVENTION

In accordance with the invention, a module package for an electronic circuit is provided which is adapted for plug connection to a circuit board by movement parallel to the board surface and which is of low profile to not interfere with the usual mechanical assembly of such circuit boards into an assembly or system. The module is of electrically conductive material to provide electrical shielding for the circuit contained therein and is grounded to the circuit by means of mounting studs which are also employed to mechanically assemble the module housing. The module has an electrically insulated coating thereon to isolate the housing from a circuit board on which it is mounted.

DESCRIPTION OF THE DRAWINGS

The invention will be more fully understood from the following detailed description taken in conjunction with the accompanying drawings in which.

DETAILED DESCRIPTION OF THE INVENTION

Figure 1:
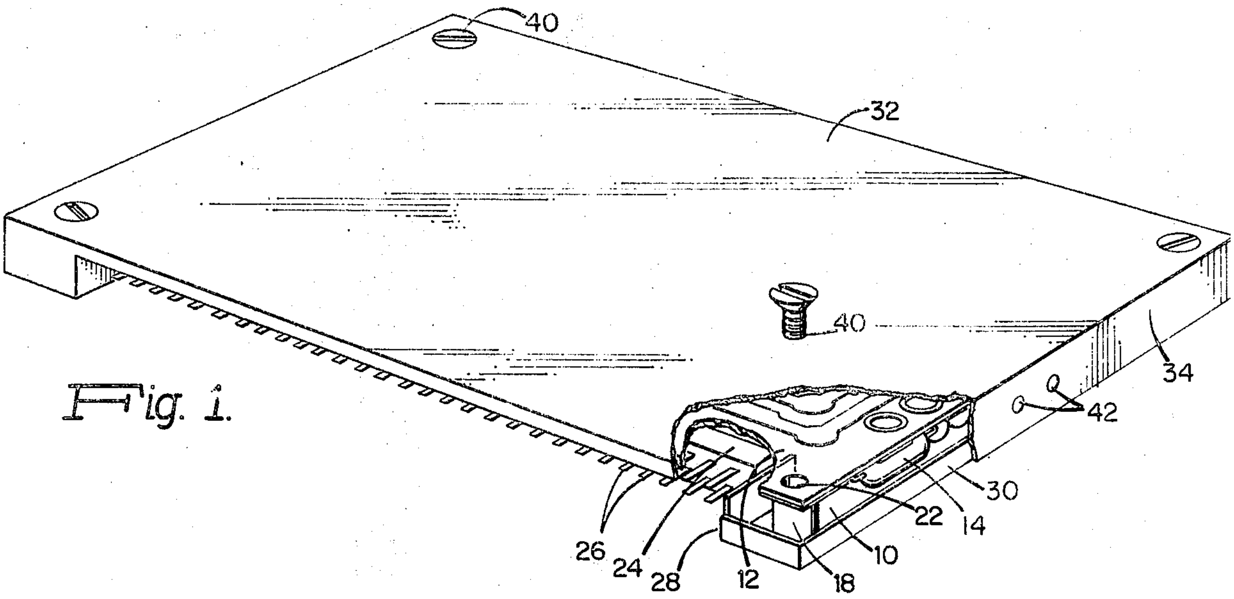
FIG. 1 is a cutaway pictorial view of a circuit module according to the invention.
Figure 2:
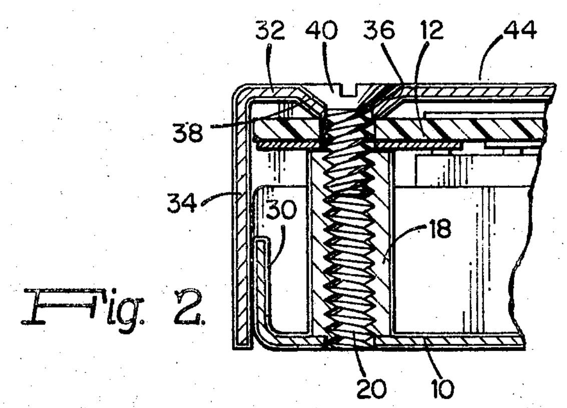
FIG. 2 is a cutaway pictorial view illustrating the cover portion of the module of FIG. 1.

The novel electronic circuit module is shown in preferred implementation in FIG. 1. A generally rectangular plate 10 has mounted thereon a printed circuit board 12 containing electronic components 14 which are interconnected by the circuit paths of board 12 to provide an intended circuit function. The circuit board 12 is mounted to plate 10 by means of four mounting pedestals or studs 18, each disposed at a respective corner of plate 10 and each having a threaded opening 20 completely therethrough. The circuit board has openings 22 at the corners thereof in alignment with the respective stud openings 20. The plate 10 is of metal or other electrically conductive material as are the studs 18 integrally affixed thereto. The circuit board has conductive paths on the surface thereof which contact the mounting studs during packaging, such that the circuit is grounded to the conductive module. The electronic circuit includes a connector 24 having pins 26 which extend in a direction parallel to the plane of the circuit and plate 10 into the opening 28 provided in plate 10. These pins are adapted for connection to a suitable connector such as that shown in FIG. 1, the connector being affixed and connected to a circuit board to which the module is to be connected.

The mounting plate 10 includes an upstanding lip 30 around the periphery thereof, as illustrated, and this lip is cooperative with cover plate 32 which includes a lip portion 34 arranged to fit over and in closely fitting relationship with lip 30 of plate 10. Cover plate 32 includes openings 36 in alignment with the openings in studs 18. The openings 36 are provided in inwardly dimpled projections 38 which are arranged to contact the conductive surface of circuit board 12 in order to electrically interconnect the cover plate and circuit for electrical grounding purposes. The plate 10, cover plate 32 and circuit contained therein are fastened together by means of machine screws 40 or other fasteners which are inserted through openings 36 in cover plate 32 and threaded into the openings of studs 18. The length of machine screws 40 is sufficiently shorter than the overall threaded length of mounting studs 18 to provide a remaining threaded portion of the studs for use in mounting the module to a circuit board by suitable machine screws or other fasteners inserted through the circuit board and threaded into the mounting studs via the openings 20 in plate 10. Openings 42 can be provided in one or more sides of the module for access to adjustble controls such as potentiometers of the packaged electronic circuit. The housing is coated with an epoxy or other electrically insulative coating 44, such that the module is electrically insulated from the circuit board on which it is mounted and to prevent inadvertent shorting of the circuit during use or during installation or removal of the module from the associated circuit board.

The invention is not to be limited by what has been shown and described except as indicated in the appended claims.

What is claimed is:

1. An electronic circuit module for providing an electrical and mechanical housing for a circuit board, said module comprising:

an electrical circuit board having a conductive surface thereon and a plurality of openings therethrough each at a respective corner of said circuit board and at least one being through said conductive surface.

a conductive plate adapted to support said circuit board and having a plurality of integral studs, a respective one of said studs being disposed at each respective corner of said plate in alignment with a respective one of said openings in said circuit board and extending from a common surface thereof;

said studs being operative for support of said circuit board thereon in spaced disposition from said common surface of said plate, each of said studs having a threaded opening completely therethrough along axes perpendicular to said common surface;

a conductive cover member of substantially the same dimensions and configuration as said common surface to form a substantially closed housing for said circuit board contained therein and having holes therethrough at each of its corners aligned with said openings in said studs, said conductive cover including:

a lip portion integral with said cover and having a height greater than that of said studs and dimensioned to be in closely fitting engagement with said plate;

a plurality of dimpled projections integral with said cover and each disposed around the periphery of said holes at a respective corner of said cover member in alignment with said studs, said projections having a height substantially equal to the difference in height between said lip and said studs and providing clearance between the top of said circuit board and said cover, at least one of said projections aligned with a conductive surface of said circuit board opposite the surface supported by said studs; and a plurality of threaded fasteners each disposed through a respective hole in said cover and opening in said circuit board and each threadably cooperative with the respective threads in said stud openings to secure said plate circuit board and cover member together to form a grounded protective housing for said circuit board thereby securing at least one dimpled projection of said cover against said conductive surface at a corner of said circuit board to maintain said board in engagement with said stud and to ground said circuit board to said housing.

2. An electronic circuit module according to claim 1 wherein the external surfaces of said conductive plate and conductive cover member have an electrically insulative coating.

3. An electronic circuit module according to claim 2 wherein said circuit board includes an elongated connector disposed along one edge thereof with terminal pins extending outwardly therefrom in a plane parallel to the surface of said circuit board;

and wherein said cover member includes an elongated opening at one side thereof adapted to accommodate said connector.

4. An electronic circuit module according to claim 1 wherein said threaded fasteners are of length less than the length of said threaded openings in said studs, the portion of said openings not threaded with said fasteners being operative for use in mounting said module to a mounting surface.

5. An electronic circuit module according to claim 2 wherein said conductive plate includes a lip portion integral therewith and dimensioned to be in closely fitting engagement with the lip portion of said conductive cover member;

an elongated opening along one edge of said plate and a cooperative opening in the lip portion of said cover member;

and wherein said circuit board includes an elongated connector disposed along one edge thereof within said elongated opening in said plate and said cover member lip portion and having terminal pins extending outwardly therefrom in a plane parallel to the surface of said circuit board and within the periphery of said cover member;

said cover member and said plate including lip portions about the periphery of said elongated openings to provide substantial shielding thereof.

* * * * *